(12) United States Patent
Vollmerhausen

(10) Patent No.: US 12,080,810 B1
(45) Date of Patent: Sep. 3, 2024

(54) PHOTOVOLTAIC IMAGE ARRAY OPERATION AT ZERO BIAS VOLTAGE TO ELIMINATE 1/f NOISE AND DARK CURRENT

(71) Applicant: Richard H. Vollmerhausen, Lake Mary, FL (US)

(72) Inventor: Richard H. Vollmerhausen, Lake Mary, FL (US)

(73) Assignee: Richard H. Vollmerhausen, Lake Mary, FL (US)

( * ) Notice: Subject to any disclaimer, the term of this patent is extended or adjusted under 35 U.S.C. 154(b) by 0 days.

(21) Appl. No.: 18/499,262

(22) Filed: Nov. 1, 2023

(51) Int. Cl.
*H01L 31/02* (2006.01)
*H01L 31/042* (2014.01)
*H04N 25/63* (2023.01)
*H04N 25/78* (2023.01)

(52) U.S. Cl.
CPC ...... *H01L 31/02021* (2013.01); *H01L 31/042* (2013.01); *H04N 25/63* (2023.01); *H04N 25/78* (2023.01)

(58) Field of Classification Search
CPC . H01L 31/02021; H01L 31/042; H04N 25/63; H04N 25/78
See application file for complete search history.

(56) References Cited

U.S. PATENT DOCUMENTS 5,262,871 A * 11/1993 Wilder .......... H04N 25/76
  348/E3.018
2020/0284883 A1* 9/2020 Ferreira .......... G01S 7/4811

* cited by examiner

*Primary Examiner* — Tony Ko
(74) *Attorney, Agent, or Firm* — John L. DeAngelis; Wolter, Van Dyke, Davis, PLLC

(57) ABSTRACT

The invention implements room temperature imaging of a photovoltaic diode image array operating in any spectral band (visible through extreme thermal). The invention also operates the photo diodes at zero bias voltage and thus eliminates 1/f (burst) noise and dark current. And the invention simplifies the electrical-mechanical interface between the readout integrated circuit (ROIC) and the photodetector array and minimizes the component count on the ROIC. These advantages are realized by multiplexing the photocurrents from each photodiode in the array according to an orthogonal or biorthogonal code set. The multiplexed current is supplied to an op amp such that zero bias is maintained for the photodetector array. The code set also allows the photocurrent generated by each photodiode to be recovered.

19 Claims, 3 Drawing Sheets

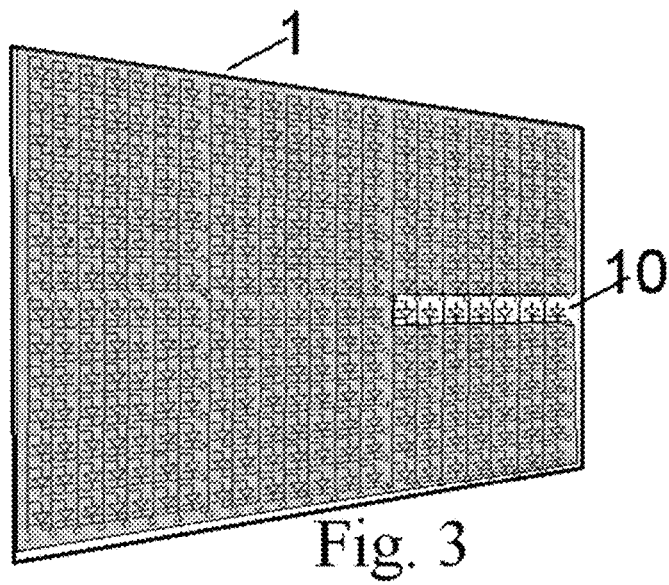
Fig. 3
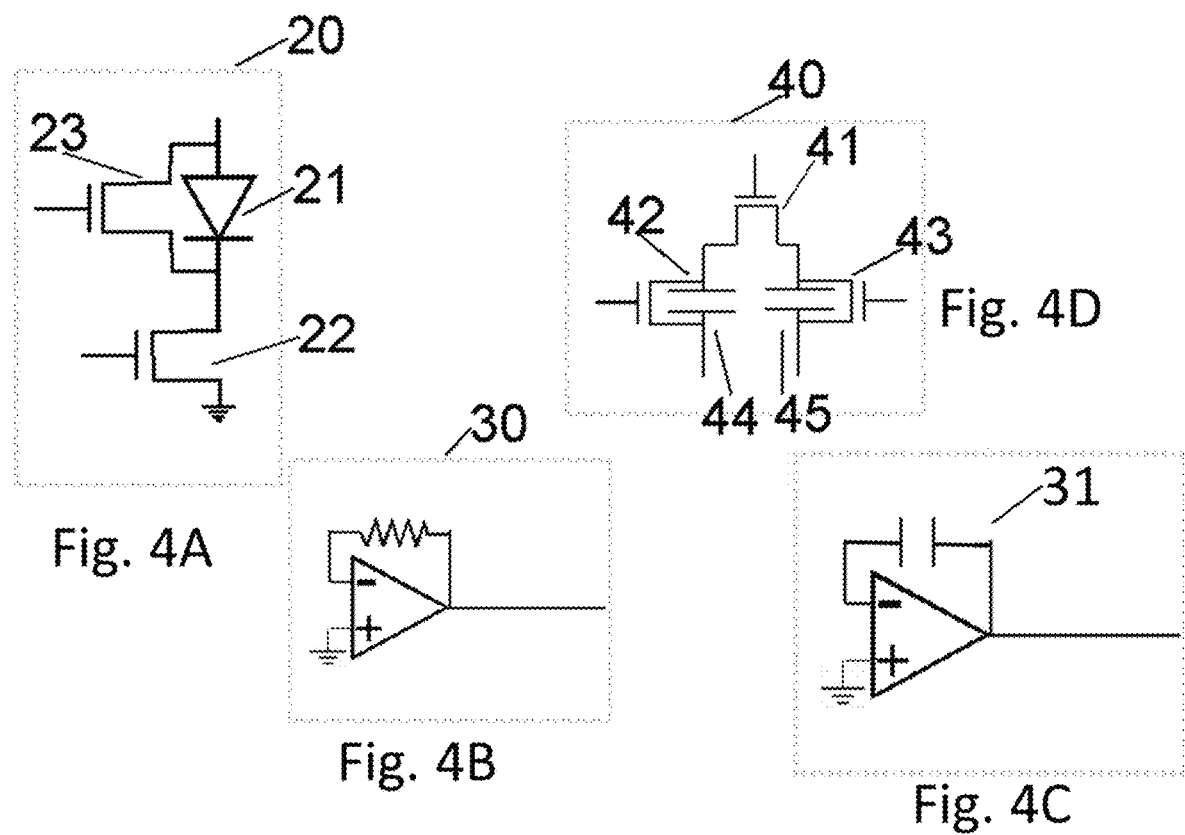
Fig. 4A
Fig. 4B
Fig. 4C
Fig. 4D

PHOTOVOLTAIC IMAGE ARRAY OPERATION AT ZERO BIAS VOLTAGE TO ELIMINATE 1/f NOISE AND DARK CURRENT

FIELD OF THE INVENTION

This disclosure describes a readout integrated circuit (ROIC) for use with a photovoltaic (PV) image array (also referred to as a photovoltaic diode array and a photovoltaic detector array) that operates all of the individual photovoltaic detectors of the array at zero bias voltage in order to support improved room temperature operation without burst noise (1/f noise) or dark current.

A photovoltaic image array and the associated readout circuit implemented using the structures and methods described in this disclosure provide, within about a factor of three, the theoretically possible signal-to-noise ratio and advantageously operate without requiring cooling of the image array.

The ROIC described in this application also simplifies fabrication of the PV image array and the ROIC by reducing electrical interconnects and transistor or op amp count.

SUMMARY

The present invention satisfies three important objectives related to operation of a photodiode array.

The first objective is to enable improved room temperature operation of a photovoltaic detector array by eliminating dark current.

The second objective is to enable imaging by photo detectors, including an array constructed of germanium photovoltaic detectors, that would otherwise exhibit excessive burst noise. The burst or 1/f noise is pumped (energized) by the bias voltage, and the noise is therefore eliminated using these zero-bias techniques of the present invention.

The third objective is to implement a producible ROIC that has fewer electrical interconnects and transistors than existing prior art technology.

Advantageously, the invention can be applied to photovoltaic diode arrays operating in any spectral band.

BACKGROUND OF THE INVENTION

U.S. Pat. No. 6,310,571 B1 dated Oct. 30, 2001 by Bidermann, entitled, "Multiplexed Multi-Channel Bit Serial Analog to Digital Converter," discloses a circuit to sequentially select a single photo site for analog to digital conversion. That is, unlike the current patent disclosure, multiple pixels are not selected simultaneously using orthogonal codes or any other mechanism. The benefits of digitizing multiple pixel-reads simultaneously are not implemented or discussed in the Bidermann patent.

U.S. Pat. No. 6,541,751 by Bidermann, "Time Multiplexing Image Processing Functions for Noise Reduction." Here Bidermann proposes a system (imager and processor) on a single chip. Noise reduction is required in this implementation because typical noise rejection or reduction techniques do not function when the imager and processor are on the same silicon substrate. To overcome this deficiency, Bidermann proposes a technique for turning off noise sources during analog-to-digital conversion. Bidermann does not propose multiplexing pixel readouts as taught by the present invention.

One technique known to CMOS designers is a multiplexed active pixel sensor. In this case, "multiplex" refers to sharing transistors between pixels to reduce wafer fabrication cost.

BRIEF DESCRIPTION OF THE FIGURES

FIG. 3 highlights a photo detector sub-array with output currents from the sub-array multiplexed by the ROIC functional components illustrated in FIGS. 4 through 6.

FIGS. 4A-4D illustrate details of the specific functional components of FIG. 5.

DESCRIPTION OF THE INVENTION

Description of Codes Used

Figure 1:
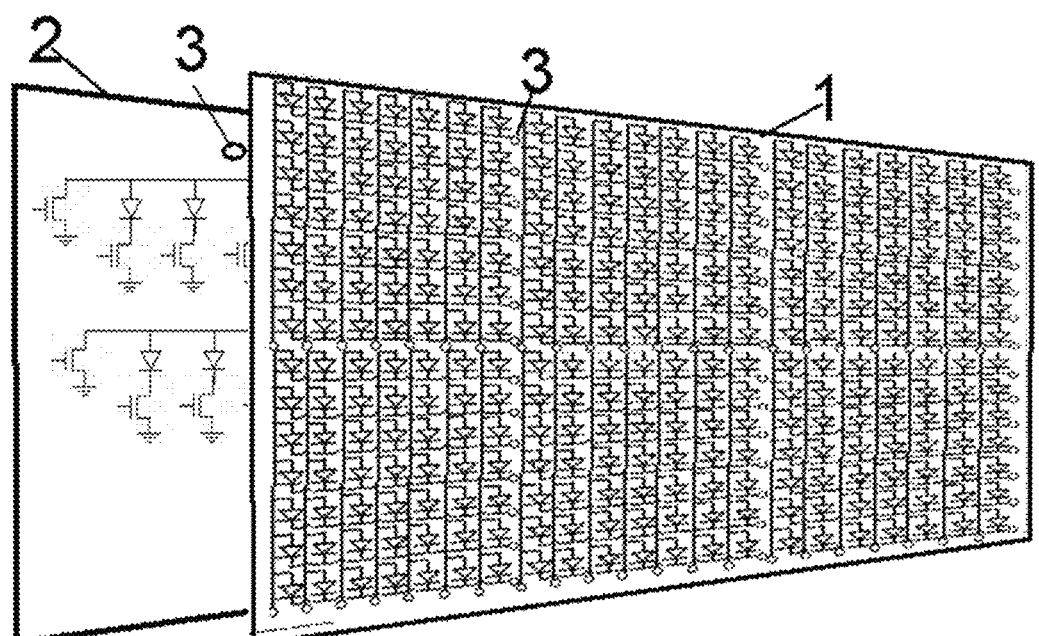
FIG. 1 illustrates one embodiment for interconnecting the photovoltaic (PV) image array and the ROIC. Specifically, the ROIC and the PV array are bump-bonded or press fit together.

In a traditional prior art ROIC, the photo current from each photo detector is stored on a capacitor, and the resulting capacitor voltage is sensed by the ROIC. The image intensity (voltage or current) values for each photo detector are read out by time-multiplexing the capacitor voltage from each detector. That is, voltage of each detector is stored on the detector capacitance or a separate capacitor and is independently sampled over time, first one, and then the next, and then the third, etcetera.

Instead of time multiplexing photo detector voltage values from capacitors, the present invention implements orthogonal code multiplexing of the photo detector current from each photo detector, with the objective of creating space on the read out integrated circuit (ROIC) by reducing the number of components required to process the photocurrent from each photo detector. The resulting available space is used for transistors or op amps that are needed to operate the detector array at zero bias. That is, by using orthogonal multiplexing, several or many photo detectors are serviced by one ROIC amplifier circuit, and that one circuit therefore has more room and can be supplemented with additional transistors and other electronic components.

In this disclosure, implementation of the invention is explained and illustrated using Walsh-Hadamard Codes. Included in that code set are Pseudo Noise Codes (PNC) and Hadamard Codes (HC) or Hadamard Matrices. PNC and HC provide the needed algorithmic behavior, using the codes is not computationally intensive, and the codes symbols consist of zeros and ones or ones and negative ones.

The required algorithmic behavior is orthogonality of the code set. That is, each code of a code set correlates with itself, but cross-correlations between different codes in the set results in either zero correlation (orthogonality) or a constant correlation value other than zero (bi-orthogonality). In the latter case, a constant signal added to all decoded values can be determined and then subtracted in order to provide the same result for bi-orthogonal codes and for orthogonal codes.

It is well known that a photovoltaic detector can be operated at zero bias voltage by connecting the two detector terminals across the differential inputs of a transimpedance-configured operational amplifier (op amp). Typically, the non-inverting terminal is grounded and by applying the op amp virtual short assumption of the two input terminals, the inverting terminal is also at 0 volts.

It is also well known by experts in the art that operating a photo detector at zero bias voltage eliminates dark current. It is also known that burst noise (also known as 1/f noise) is pumped or energized by the detector bias voltage, and thus the burst noise also disappears when the detector is operated at zero bias.

The voltage output of the transimpedance-configured op amp is proportional to the photovoltaic detector current (photocurrent), which is in turn responsive to the illumination.

The problem with operating a large array of photo detectors at zero bias is the complex circuitry required to implement a zero-bias condition for every detector in the large array. Several transistors and op amps plus associaed electronic components are needed to create an op amp capable of canceling the photo detector current. Since modern image photo detector arrays have a million or more small photo detectors, there is insufficient space to include an op amp circuit for each photo detector in the photo array.

The preset invention provides a practical technique for operating a large array of photo detectors at zero bias voltage.

According to the invention, the current generated by a few, some, many, or all of the photo detectors in an array is selectively combined to thereby minimize the circuitry needed to operate those detectors at zero bias. Since individual photo currents are switched on and off using orthogonal code sequences, the signal representing the summed currents can be processed to recover the individual current amplitude (photocurrent values) from each photo detector. In other words, the current representing the image intensity at each photo detector is recoverable, albeit the current from several photodetectors have been combined.

Each detector photocurrent is processed using a single code that adds or subtracts (or adds and does not add) its current to generate a sum photocurrent signal. That is, the photo detector currents are combined differently over time, the photocurrents added or subtracted or added and not added changes over time.

The process described here is also known as orthogonal code multiplexing and in this invention is applied to output photocurrents from an array or from a sub-array of photo detectors. All the photo detectors in the entire image array are included in one of the sub-arrays. All sub-arrays are then sampled simultaneously or in time sequence or in any combination thereof.

Addition of the photo currents changes over time, with each photo detector contributing current according to an orthogonal code time sequence.

Since only one op amp circuit is required to orthogonally multiplex several or many photo detector signal currents, this invention enables zero voltage bias operation of all the detectors in an array of photovoltaic detectors using a number of op amps that is far less than one op amp for each PV detector. Since each ROIC circuit samples many photo detectors, there are fewer ROIC circuits than photo detectors. More and more photo detectors can be sampled by one ROIC circuit so that space on the substrate is available for other complex circuit designs.

The varying sum (over time) of those on-off or differential signal sequences is decoded in order to determine the intensity values (the photocurrent generated) by each individual photo detector. Decoding is possible because the sequence generated by each individual photo detector is orthogonal or bi-orthogonal to the codes generated by the other photo detectors in the array.

For example, consider the PNC encoding set (1 1 0), (1 0 1) and (0 1 1). As a PNC sequence, this code set is bi-orthogonal by nature, but the constant added to each cross correlation can be made zero by decoding using the code set (1 1 −1), (1 −1 1), and (−1 1 1) as a decode set or sequence. If the first three-element encoding code sequence is used to sample the signal from three detectors with photo currents of A, B, and C, and the decoding three-element code sequence is used to decode the signal, then the following result is obtained. Note that a period-asterisk (.*) below indicates array multiplication, and the asterisk alone (*) indicates multiplication.

The values A, B, C are encoded over time, meaning that the first sample at a first time connects A and B to an op amp to integrate the combined signal, the second sample at a second time connects A and C to the op amp, the third sample at a third time connects B and C.

$$A*[1\ 1\ 0]=[A\ A\ 0]$$

$$B*[1\ 0\ 1]=[B\ 0\ B]$$

$$C*[0\ 1\ 1]=[0\ C\ C]$$

Note that each sample is the vertical sum, so the samples are A+B, A+C, and B+C. Decoding these samples (using a complementary code set) in an image processor according to the following scheme.

$$[A+B\ A+C\ B+C].*[1\ 1\ -1]=A+B+A+C-B-C=2A$$

$$[A+B\ A+C\ B+C].*[1\ -1\ 1]=A+B-A-C+B+C=2B$$

$$[A+B\ A+C\ B+C].*[-1\ 1\ 1]=-A-B+A+C+B+C=2C$$

So each decode operation results in twice the value of one photo detector current and the values of the other photo detectors do not contribute to the result. There is a gain of integer value (length of PNC/2+1), which in this case is 2 because the PNC length is three.

Codes other than Walsh-Hadamard PNC and HC can be used, if the code set is orthogonal or bi-orthogonal.

One example of an alternative code set is sine waves; that is, a set of sines and cosines that make up a discrete Fourier code set.

Using the multiplex codes requires summing signal photocurrents from several detectors, and that results in an increased shot (photon) noise level. The noise increases with code length, so code length is limited to that necessary for a particular application. That is, day cameras can use long code lengths, but short codes lengths are used for night vision because there is much more light during the day.

As an example of the signal-to-noise ratio trade-off, consider a row of 2047 photo detectors. A single PN code requires only a single op amp circuit. However, in another embodiment, the row can be broken into four, 511 length PN codes, thereby requiring four op amp circuits in order to improve the signal-to-noise ratio by a factor of two.

This invention uses the orthogonal codes so that multiple photo detectors can be serviced by one operational amplifier. That is, a trade is made to give up some noise performance in order to provide space on the ROIC for the required circuitry.

Since the present invention eliminates both 1/f noise and dark current noise sources, the noise performance of the imaging array exceeds currently available technology and enables solid state imaging solutions not currently available by other methods.

For example, an image array implemented using the methods described in this disclosure and operating in the short-wave infrared (SWIR) spectral band can provide excellent imaging under overcast starlight conditions and thereby offers a solid-state replacement for current image intensifiers.

The formula for increased noise is $(2N)^{1/2}$ where N is the code length. In other words, in theory, the invention described in this disclosure has noise worse than the theoretical-best by the square root of 2 multiplied by N, where N is the selected code length.

The noise values described in the last paragraph are for encoding using 0 and 1 and decoding using 1 and −1 as shown in the PNC coding and decoding example above.

Although long codes increase noise, they also reduce the number of electrical interconnects between photo detectors and the ROIC. Long codes also reduce the number of transistors (op amps) needed in the ROIC. Thus, ROIC simplicity can be improved by accepting increased noise, when the increased noise does not affect the imager application.

Note that, in this patent application, "operational amplifier" refers to the electrical circuitry needed to operate one or more photo diodes at zero bias. Any circuit that accomplishes that function is an "operational amplifier" regardless of its other design attributes. The term "operational amplifier" is used herein because it is a common technique to achieve zero bias photovoltaic detector operation.

Description of the Hardware Elements

A more complete understanding of these embodiments, and the attendant advantages and features thereof, will be more readily understood by reference to the following detailed description when considered in conjunction with the accompanying drawing. The drawings described herein are shown only for illustrative purposes. Not all possible apparatus configurations are included and the embodiments shown are not intended to limit the scope of the present invention.

The invention has the potential to be configured in multiple versions so as to generate superior technical performance in any given application. Therefore, it is understood that in some configurations not all elements will be necessary for the specific embodiment or implementation of the invention. It should also be apparent that there is no restrictive one-to-one correspondence between any given embodiment of the invention and the elements in the drawing.

For clarity and in order to emphasize certain features, all of the invention features are not shown in the drawing, and all of the features that might be included in the drawing are not necessary for every specific embodiment of the invention. The invention also encompasses embodiments that combine features illustrated in the drawing; embodiments that omit, modify, or replace some of the features depicted; and embodiments that include features not illustrated in the drawing.

As used herein, relational terms, such as "first" and "second," "top" and "bottom," and the like, may be used solely to distinguish one entity or element from another entity or element without necessarily requiring or implying any physical or logical relationship or order between such entities or elements.

The drawings are integral to the application and are included to illustrate the apparatus and associated method.

Embodiments of the present disclosure will be described more fully hereinafter with reference to the accompanying drawings in which like numerals and numerals appended with letters represent like elements throughout the several figures, and in which example embodiments are shown. Embodiments of the claims may, however, be embodied in many different forms and should not be construed as limited to the embodiments set forth herein. The examples set forth herein are non-limiting examples and are merely examples among other possible examples.

Any reference to "invention" or "orthogonal multiplexing" within this document is a reference to an embodiment of a family of inventions, with no single embodiment including features that are necessarily included in all embodiments, unless otherwise stated. Furthermore, although there may be references to "advantages" provided by some embodiments, other embodiments may not include those same advantages, or may include different advantages. Any advantages described herein are not to be construed as limiting to any of the claims.

Specific quantities, dimensions, spatial characteristics, compositional characteristics and performance characteristics may be used explicitly or implicitly herein, but such specific quantities are presented as examples only and are approximate values unless otherwise indicated. Discussions and depictions pertaining to these, if present, are presented as examples only and do not limit the applicability of other characteristics, unless otherwise indicated.

In describing preferred and alternate embodiments of the invention, specific terminology is employed for the sake of clarity. The technology described herein, however, is not intended to be limited to the specific terminology so selected, and it is to be understood that each specific element includes all technical equivalents that operate in a similar manner to accomplish similar functions.

The drawings use a combination of electrical symbols, logic symbols and pictorial representations to illustrate the elements of the invention. In the interest of clarity, the symbols are simplified and do not explicitly show unneeded detail.

Example embodiments will now be described more fully with reference to the accompanying drawings of the invention. Specific details are set forth such as examples of specific components and methods to provide a thorough understanding of embodiments of the present disclosure. It will be apparent to those skilled in the art that specific details need not be employed, that example embodiments may be embodied in many different forms, and that neither should be construed to limit the scope of the disclosure. In some example embodiments, well-known device structures are not described in detail.

The invention has the potential to be configured in multiple versions so as to generate superior technical performance in any given application. Therefore, it is understood that in some configurations not all elements will always be necessary for the specific embodiment or implementation of the invention. It should also be apparent that there is no restrictive one-to-one correspondence between any given embodiment of the invention and the elements in the drawing.

In the drawings, a generic FET (field effect transistor) symbol is used to indicate an electronic switch. That is a drawing convenience. The drawings are logic diagrams to instruct implementation by those skilled in the electronics art, and the drawings are not intended to represent functional electronic circuits. The electronic symbols are used to indicate function and invention implementation approach.

FIG. 1, depicts an array of photovoltaic detectors 1 operative with an ROIC 2 comprising electronic circuitry to sense the image intensity signals (photocurrent) generated by the detector array 1. Bump bonds or press fit surfaces 3 (disposed on both the photovoltaic array 1 and the ROIC 2) provide the electrical connections needed between the photo detector array and the ROIC.

Figure 2:
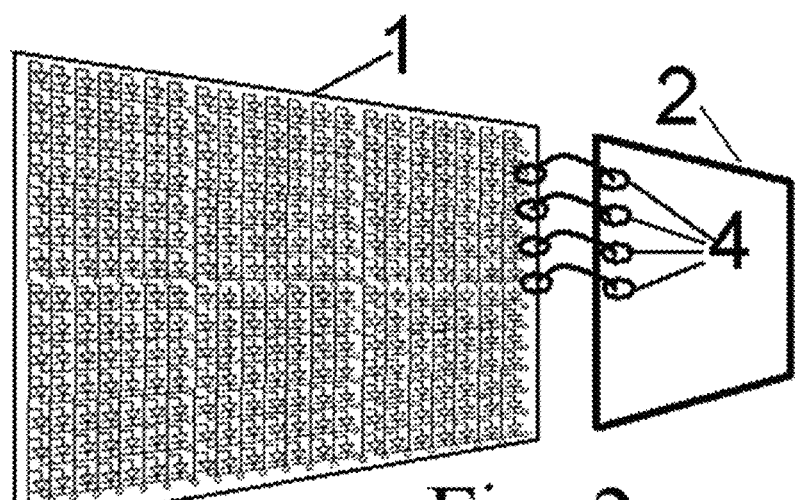
FIG. 2 illustrates that in an embodiment with the number of interconnects limited to a minimum, by using a long multiplex code, the PV diode array and the ROIC can be wire bonded.

FIG. 2 illustrates an embodiment employing wire bonds 4 interconnecting the photovoltaic detector array 1 and the ROIC 2, that is the electronic circuitry disposed on the ROIC 2. The FIG. 2 configuration can be used if long PN codes are used thereby limiting the number of interconnects needed between detector array 1 and the ROIC 2.

FIGS. 1 and 2 are possible configurations of the detector array and the ROIC, but a single, integrated circuit can also be fabricated by depositing the photo detectors on the ROIC substrate. For example, both silicon photo detectors and germanium photo detectors can be deposited on the ROIC substrate.

Figure 5:
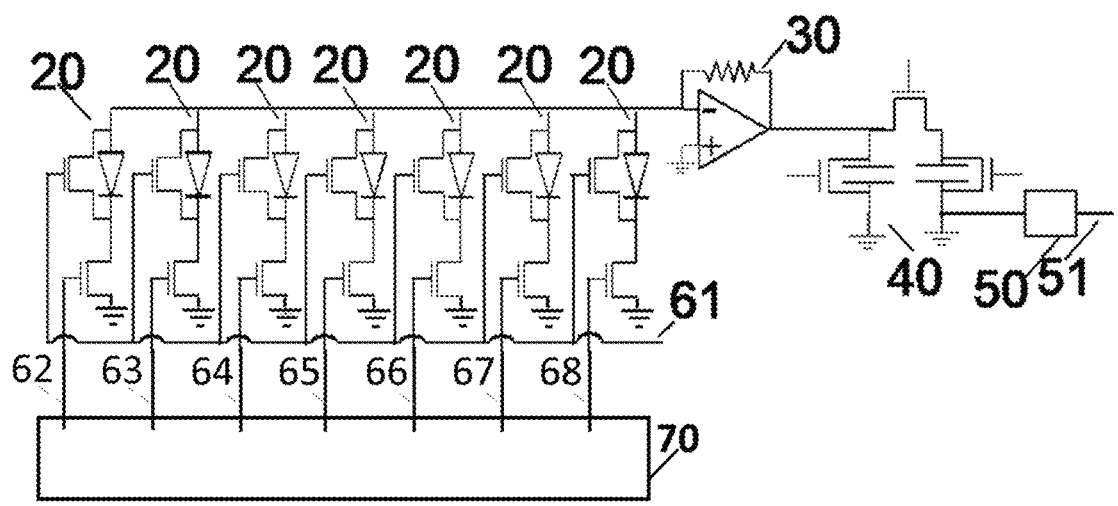
FIG. 5 illustrates an interconnect circuit for decoding pixel intensity values.
Figure 6:
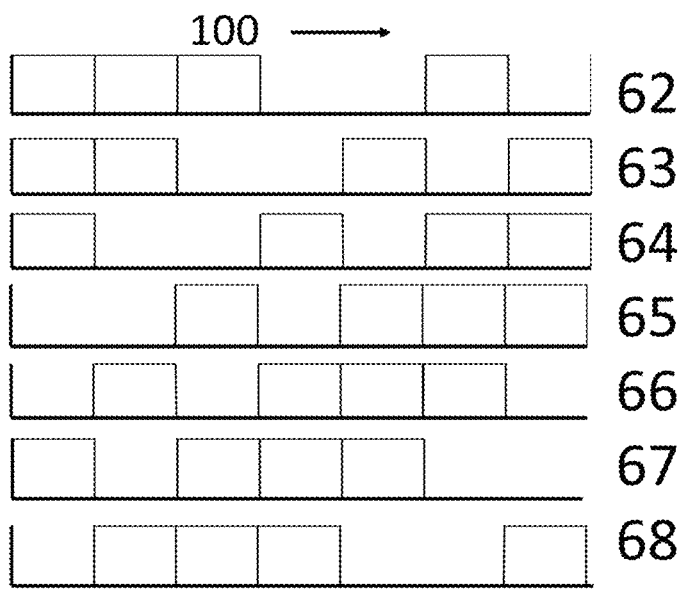
FIG. 6 illustrates timing diagrams associated with operation of FIGS. 3 through 5.

FIG. 3 highlights a sub-array 10 of the photodetector array 1, that is described in more detail in FIGS. 4, 5, and 6. The sub-array 10 comprises seven photo detectors, but any number of photo diodes can be processed together as a subarray using the methods described in this disclosure. Also, it is not required that all the multiplexed photo diodes are disposed in the same row or column, but it is often convenient to multiplex row or column photo detectors due to simplification of the wiring layout.

FIGS. 4A, 4B, 4C, and 4D detail respective sub-sections 20, 30, 31, and 40 associated with each sub-array of seven photo diodes. The PN code is seven bits long to multiplex the seven diodes in sub-array 10 illustrated in FIG. 3. Each circuit element 20, 30, 31, and 40 is depicted in FIG. 5 to multiplex the sub-array 10.

In FIG. 4A, the electronic section 20 includes a photovoltaic diode 21, a FET 22 to switch the photodetector current signal into and out of the multiplexed signal, and a FET 23 to dump charge on the photo diode that accumulates when the photo diode is not connected to the op amp, i.e., when the photocurrent is not multiplexed with other photocurrents. The photo diode 21 is not connected to the op amp when the FET 22 is open, and during that time charge accumulates on the photo diode; that charge should not be added to the next photodetector current sample. The charge is dumped onto a conductor 61 of FIG. 5.

In FIG. 4B, the sub-section 30 comprises a transimpedance op amp and a feedback resistor. At different times, according to the code sequence, the op amp (at the op amp inverting input terminal) senses the current flow from one or more of the photo diodes of the subarray 10; operation of the op amp is well known to electrical engineers.

In FIG. 4C, an integrator op amp configuration 31 might be used instead of the transimpedance amplifier 30 of FIG. 4B due to thermal noise if the electronics design calls for a large resistance.

The electronics components in circuit 40 of FIG. 4D integrate and store the photo detector photocurrents for later digitizing. A capacitor 44 stores the multiplexed current for one period, where one period is the frame time or dwell time divided by the length of code. A FET 41 closes and moves the charge to a capacitor 45 for digitization; the digitization circuit is not shown in FIG. 4D or FIG. 5, but those skilled in the art are familiar with techniques for digitizing an analog signal, such as the multiplexed photocurrent in this disclosure. A FET 42 resets or shorts the capacitor 44 to ground in preparation for the next current sample. A FET 43 resets capacitor 45 after the sampled current signal is digitized.

In FIG. 5, the electronic circuit 20 of FIG. 4A is repeated seven times, once for each of the seven photodetectors (of the sub-array 10) in FIG. 5. The op amp circuit 30 (FIG. 4B) or integrator circuit 31 (FIG. 4C) and the circuit 40 of FIG. 4D are depicted once in FIG. 5. FIG. 4C is an alternative circuit for 4B. That is, all the photo detectors 20 supply current to the op amp 30 configured as in FIG. 4B or FIG. 4C, but not both. As discussed above, the circuit components 40 store the current.

The FETs 22 (in FIG. 4A) also appear in FIG. 5 as elements of subsection 20. These FETs are controlled to an opened configuration according to an encoding orthogonal or biorthogonal code sequence as described herein, to sample the current from the associated photodiode. A control circuit 70 controls the configuration of each FET 22 (FIG. 4A) by applying a voltage to the gate terminal at one or more of the FETs 22, according to the encoding code set.

FIG. 5 depicts a digitization circuit 50 (operation of which is known to those skilled in the art) with an output 51 to be processed in a digital or processor. Circuit 50 and output 51 can also perform an analog decode of the multiplexed signals.

FIG. 6 depicts a timing diagram for the control circuit 70. An arrow 100 indicates the direction of time flow. Control signals 62, 63, 64, 65, 66, 67, and 68 (also referenced in FIG. 5) control the current path from the associated photodiode. When a high control voltage is applied to one or more of the FETs 22 (see FIG. 4A) the associated photo diode is connected to the op amp of sub-section 30 and the charge on that photodiode is sampled, that is, the current derived from that photodiode charge is input to the inverting terminal of the op amp. During a low or zero condition of one or more of the control signals 62, 63, 64, 65, 66, 67, and 68 the associated photo diode is not connected to the op amp. In other words, a high level of one or more of the control signals 62 through 68 indicates the time during which the associated photodiode current is integrated or multiplexed into the current supplied to the op amp. FET 22 of FIG. 4A is closed (conducts current) for a small fraction of the sampling period if the FET 22 was open in order to dump any charge residual from the previous sample.

In this example, all of the photo diodes in the photo detector array 1 are grouped into units of seven as illustrated by sub-array 10 in FIG. 3, and the components of FIGS. 4A-4D and FIG. 5 are operative with each group of seven photodiodes.

This example uses many interconnects between the transistors and ROIC to the photo diode array, but this configuration also has a signal-to-noise advantage over the use of longer codes if an advantageous signal-to-noise advantage is needed for a particular application.

What is claimed is:
1. A photovoltaic detector array comprising:
   a plurality of photodiodes, each photodiode generating a photocurrent responsive to illumination received by the photodiode;
   a plurality of switches controllable to an opened or a closed configuration, a switch of the plurality of switches configured in series with one of the plurality of photodiodes;
   certain switches of the plurality of switches controlled to the closed configuration according to a corresponding element of an encoding code set;

a multiplexed array current formed by combining current from each photodiode associated with a closed configuration of a switch;

a device for applying a complementary decoding code set to the multiplexed array current or to a voltage responsive to the multiplexed array current, thereby generating a current or a voltage representative of the photocurrent generated by each photodiode; and further comprising a switchable shorting element connected across the terminals of each photodiode, the switchable shorting element controllably closed to short photocurrent generated by charge on the photodiode.

2. The readout circuit of claim 1, wherein the encoding and decoding code set comprises an orthogonal or a bi orthogonal code set.

3. The readout circuit of claim 1, wherein each switch controlled to the closed configuration connects the associated photodiode across input terminals of an op amp such that the multiplexed array current is input to the op amp, and wherein an output voltage of the op amp is responsive to the multiplexed array current.

4. The readout circuit of claim 3, wherein connecting the terminals of a photodiode across the input terminals of an op amp operates the photodiode at zero bias.

5. The readout circuit of claim 1, further comprising a digitizing element for converting the multiplexed array current to a digital value.

6. The readout circuit of claim 1, wherein a series configuration of each photodiode and each switch is connected across input terminals of an op amp, such that when a switch is controlled to a closed configuration a photocurrent generated by the photodiode in series with a closed switch is input to the op amp.

7. The readout circuit of claim 6, wherein the op amp performs an integration operation on photocurrent input thereto.

8. The readout circuit of claim 1, wherein each one of the plurality of switches comprises a field effect transistor or a bipolar transistor.

9. A method for generating a current or a voltage representative of illumination received by a photovoltaic detector array employing the photodetector array of claim 1.

10. A readout circuit for use with a photovoltaic detector array comprising a plurality of photodiodes, the readout circuit comprising:

each photodiode generating a photocurrent responsive to illumination received by the photodiode;

a plurality of switches controllable to an opened or a closed configuration, each switch of the plurality of switches configured in series with one of the plurality of photodiodes;

an op amp having an inverting and a non-inverting terminal;

each serial string comprising a photodiode and a switch connected across the inverting and non-inverting terminals of the op amp;

one or more switches of the plurality of switches controlled to the closed configuration according to a corresponding element of an encoding code set;

wherein photocurrent generated by each photodiode in series with a closed switch is input to the op amp, a multiplexed array current comprising all current input to the op amp;

the op amp for converting the multiplexed array current to a voltage;

an analog-to-digital converter for digitizing the voltage, producing digital voltage values; and a device for applying a complementary decoding code set to the digital voltage values, thereby generating a voltage value for each photodiode that is representative of the photocurrent generated by each photodiode.

11. The readout circuit of claim 10, wherein the encoding and decoding code set comprises an orthogonal or a bi-orthogonal code set.

12. The readout circuit of claim 10, wherein connecting the serial string across the inverting a non-inverting terminals of the op amp zero biases the photodiode.

13. The readout circuit of claim 10, wherein the readout circuit is disposed on a first substrate and the photovoltaic detector array is disposed on a second substrate, the first and second substrates electrically connected by conductive bump bonds, by press fit interfacing surfaces, or by wire bonds.

14. The readout circuit of claim 10, wherein the readout circuit and the photovoltaic detector array are disposed on a same substrate.

15. The readout circuit of claim 10, wherein the photovoltaic detector array comprises a plurality of photovoltaic detector subarrays, each subarray comprising a plurality of photodiodes.

16. The readout circuit of claim 10, wherein each one of the plurality of switches comprises a field effect transistor or a bipolar transistor.

17. The readout circuit of claim 10, wherein the op amp performs an integration operation on the photocurrent input thereto.

18. The readout circuit of claim 10, wherein a code length of the encoding code set and a code length of the decoding code set are responsive to lighting conditions in which the photovoltaic detector array is operating.

19. The readout circuit of claim 10, wherein a number of bits in the encoding code set equals a number of photodiodes in the plurality of diodes.

* * * * *